United States Patent
Eaton

(10) Patent No.: US 8,094,843 B2
(45) Date of Patent: Jan. 10, 2012

(54) LOW-PROFILE PIEZOELECTRIC SPEAKER ASSEMBLY

(75) Inventor: William Chris Eaton, Cary, NC (US)

(73) Assignee: Sony Ericsson Mobile Communications AB, Lund (SE)

( * ) Notice: Subject to any disclaimer, the term of this patent is extended or adjusted under 35 U.S.C. 154(b) by 1015 days.

(21) Appl. No.: 12/023,496

(22) Filed: Jan. 31, 2008

(65) Prior Publication Data

US 2009/0196442 A1    Aug. 6, 2009

(51) Int. Cl.
*H04R 25/00* (2006.01)

(52) U.S. Cl. ................................ 381/190; 381/111

(58) Field of Classification Search .............. 381/111, 381/190
See application file for complete search history.

(56) References Cited

U.S. PATENT DOCUMENTS

| | | |
|---|---|---|
| 5,376,853 A | 12/1994 | Fushimi |
| 6,396,197 B1 | 5/2002 | Szilagyi et al. |
| 6,453,045 B1 | 9/2002 | Zurek et al. |
| 6,865,785 B2 | 3/2005 | Ogura et al. |
| 2004/0205949 A1 | 10/2004 | Takeshima et al. |
| 2005/0129261 A1 | 6/2005 | Ito et al. |

FOREIGN PATENT DOCUMENTS

| | | |
|---|---|---|
| JP | 57045799 | 3/1982 |
| JP | 61234696 | 10/1986 |
| JP | 2001016691 | 1/2001 |

OTHER PUBLICATIONS

Piezoelectric Transducers: Distributed Mode Actuators. Ebook provided by Audio Products Division of National Semiconductor Analog Products Group, Santa Clara, CA.
PCT—International Search Report dated Nov. 12, 2008, for Application No. PCT/US2008/073445, Filed Aug. 18, 2008.

*Primary Examiner* — Richard A. Booth
(74) *Attorney, Agent, or Firm* — Coats & Bennett, P.L.L.C.

(57) ABSTRACT

A low-profile speaker assembly comprises a substrate and a substantially plan piezoelectric element disposed in a plane substantially parallel to the substrate and mechanically connected to the substrate at one or more edges. A tuning mass is attached to a face of the piezoelectric element, to improve low-frequency performance of the speaker assembly. In some embodiments, the tuning mass is disposed on the surface of the piezoelectric element facing the substrate. The substrate, which may comprise a printed circuit board, may include a cut-out region arranged to allow movement of the tuning mass within the cut-out region.

14 Claims, 5 Drawing Sheets

LOW-PROFILE PIEZOELECTRIC SPEAKER ASSEMBLY

BACKGROUND

The present invention relates generally to speakers and, more particularly, to a low-profile piezoelectric speaker assembly suitable for use as an ear speaker in a mobile phone.

Advances in communication and manufacturing technologies have resulted in mobile devices, such as mobile telephones and personal digital assistants, becoming increasingly smaller in size. In particular, mobile phone manufacturers are striving to reduce the thickness of their devices in response to consumer demands. One consequence of these size reductions is that less space is available for speakers and other components. While users prefer mobile devices with small form factors, consumers still expect high quality audio output from their mobile devices. Therefore, there is great interest among manufacturers in finding ways to reduce the size of speakers while maintaining high quality audio output.

The problem of limited space is especially acute with respect to ear speakers in an ultra-thin, "clam-shell" phone design because the overall thickness of the phone (in its closed position) is typically divided between an upper housing, which includes the ear speaker and, in many cases, an LCD display, and a lower housing, which includes a keypad and battery. The overall thickness of the closed phone may be less than 12 millimeters—thus, an ear speaker assembly having a thickness of 1 to 2 millimeters, or even less, is highly desirable.

Ceramic piezoelectric speakers are therefore increasingly being investigated as alternatives to traditional dynamic speakers. In addition to being thinner, ceramic piezoelectric speakers are generally less sensitive to the acoustic cavity in which they are placed. However, using conventional approaches, it is difficult to achieve enough response at low frequencies to meet acoustic requirements for mobile phone applications with ceramic piezoelectric speakers.

SUMMARY

The present invention relates to a low-profile speaker assembly for portable electronic devices, such as cellular telephones, personal digital assistants (PDAs), and audio players. The low-profile speaker assembly comprises a substrate and a substantially planar piezoelectric element disposed in a plane substantially parallel to the substrate and mechanically connected to the substrate at one or more edges. A tuning mass is attached to a face of the piezoelectric element, to improve low-frequency performance of the speaker assembly. In some embodiments, the tuning mass is disposed on the surface of the piezoelectric element facing the substrate. The substrate, which may comprise a printed circuit board, may include a cut-out region arranged to allow movement of the tuning mass within the cut-out region.

A low-profile speaker assembly constructed according to the techniques described herein is particularly suited for an ear speaker in a portable communications device, such as a mobile phone. Accordingly, one or more embodiments of the present invention comprise a communication device including a housing and an ear speaker assembly disposed within the housing; the ear speaker assembly comprising a piezoelectric element with an attached tuning mass.

DETAILED DESCRIPTION

Figure 1A:
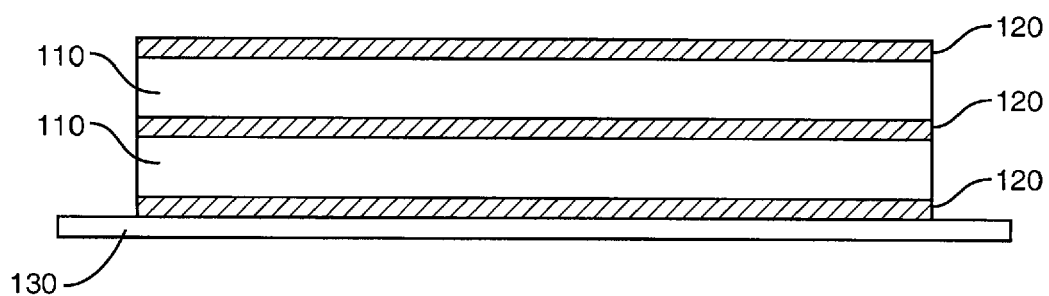
FIG. 1 is a cross-sectional view of a multi-layer piezoelectric element.
Figure 1B:
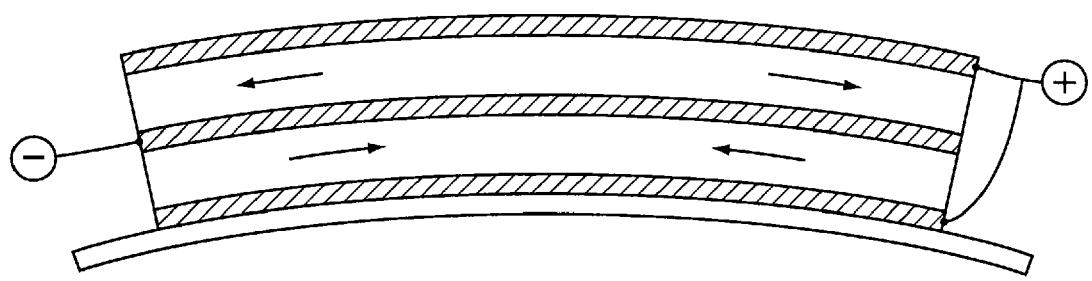
Figure 1C:
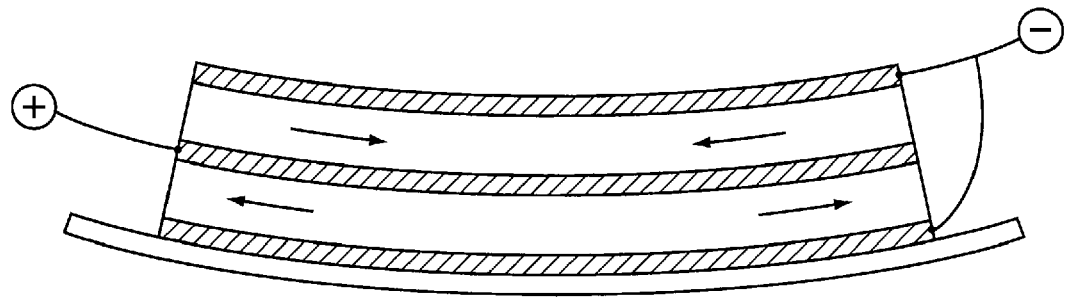

Referring now to the drawings, FIGS. 1A-1C provide a simplified representation of a piezoelectric speaker element. FIG. 1A illustrates a cross-sectional view of a piezoelectric element 100 comprising two layers of piezoelectric material 110 separated by a metallic conductor layer 120. An additional conductor layer 120 is on each of the top and bottom of the two-layer structure, and the entire structure is on top of a plate 130.

As is well known in the art, a voltage applied across a piezoelectric material will cause the material to expand or contract, depending on the voltage polarity and the polarity of the piezoelectric material. FIGS. 1B and 1C illustrate the results from applying voltages of alternating polarities to the electrodes 120, thus creating electric fields across the piezoelectric layers 110. In FIG. 1B, the voltage and material polarities cause the upper piezoelectric layer 110 to expand horizontally, while the lower layer 110 contracts. The resulting tension between the layers causes the overall structure to bend. In FIG. 1C, the application of electric fields in the opposite directions causes the overall structure to bend in the opposite direction from FIG. 1B. Devices like piezoelectric element 100 are thus frequently called "benders," although those skilled in the art will appreciate that the bending in FIGS. 1B and 1C is greatly exaggerated. In any event, as is well known in the art, the application of a varying voltage (e.g., an audio signal) will cause the piezoelectric element 100 to bend back and forth in a vibrating motion; the vibration energy is transmitted to the air as sound. As is also well known in the art, more than two piezoelectric layers may be stacked, to amplify the bending effect; inactive layers, such as the plate 130 in FIG. 1, may be employed in various configurations to further amplify the vibrations and/or to transmit the vibration energy across a larger surface area.

Piezoelectric speaker elements are now manufactured in a number of configurations. The applications of low-temperature co-fired ceramic (LTCC) technologies and multilayer fabrication techniques have resulted in widespread availability of very thin, inexpensive, piezoelectric speaker elements, which exhibit several advantages over conventional magnet-based speakers. In particular, the generally planar configuration of these elements results in a very thin device, facilitating very low-profile configurations. In addition, the absence of a permanent magnet eases concerns about interference between the speaker and other components in a compact product.

Figure 2:
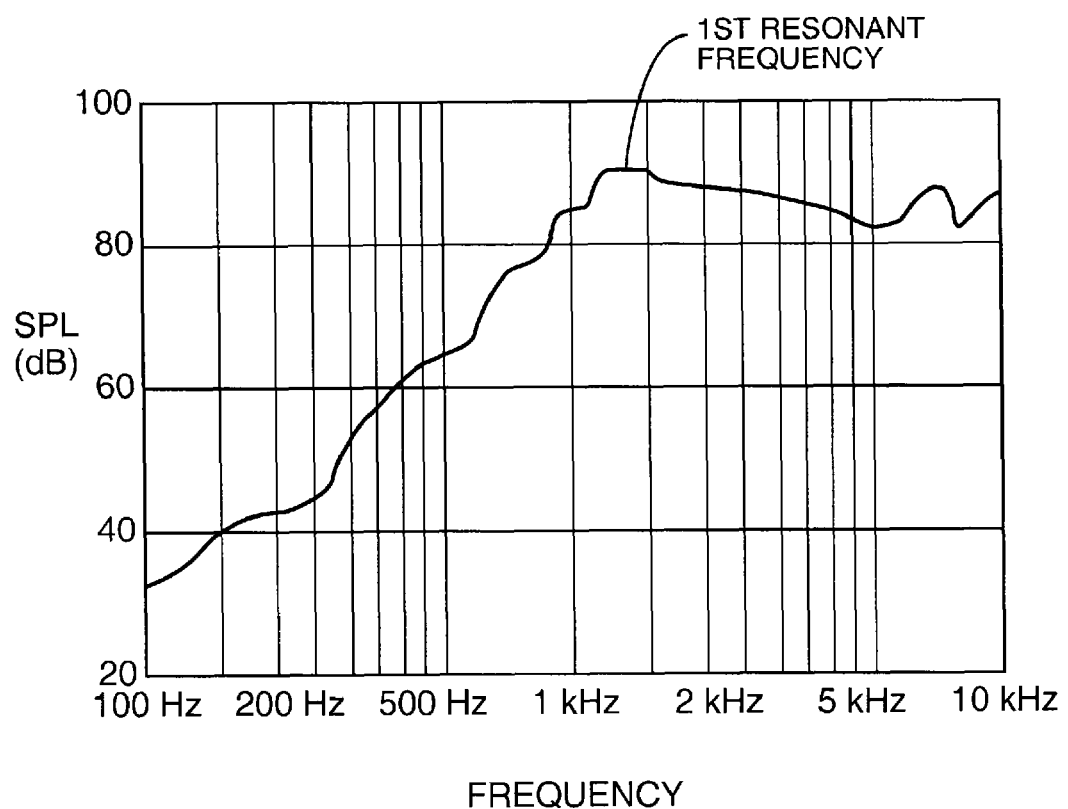
FIG. 2 illustrates a typical frequency response for a conventional piezoelectric speaker element.

However, low-end frequency response remains a significant problem with conventional piezoelectric elements employed as speakers. A typical piezoelectric element exhibits one or more resonant frequencies, which are generally a function of the physical dimensions of the device. The frequency response of a piezoelectric speaker typically falls off rapidly below the lowest of these resonant frequencies. A frequency response for a piezoelectric speaker element with several resonances is illustrated in FIG. 2. In the illustrated frequency response, the first resonance is somewhat above one kilohertz; below that frequency, the response is increasingly poor. For this reason, piezoelectric speaker elements, while increasingly used as tweeters in multi-element speaker systems, have found limited use in ear speakers for mobile phones.

The low-frequency response of a piezoelectric element can be improved by attaching a mass to the planar device, at a location away from the periphery of the device. Those skilled in the art will appreciate that the addition of such a mass will affect the high-frequency response of the device as well, and may increase distortion somewhat. However, in many applications, high-frequency response and distortion may be "traded" for improved low-frequency response. This has been demonstrated to be particularly true in attempting to meet the acoustic requirements imposed by the $3^{rd}$-Generation Partnership Project (3GPP) specifications for GSM and Wideband-CDMA mobile terminals.

Figure 3A:
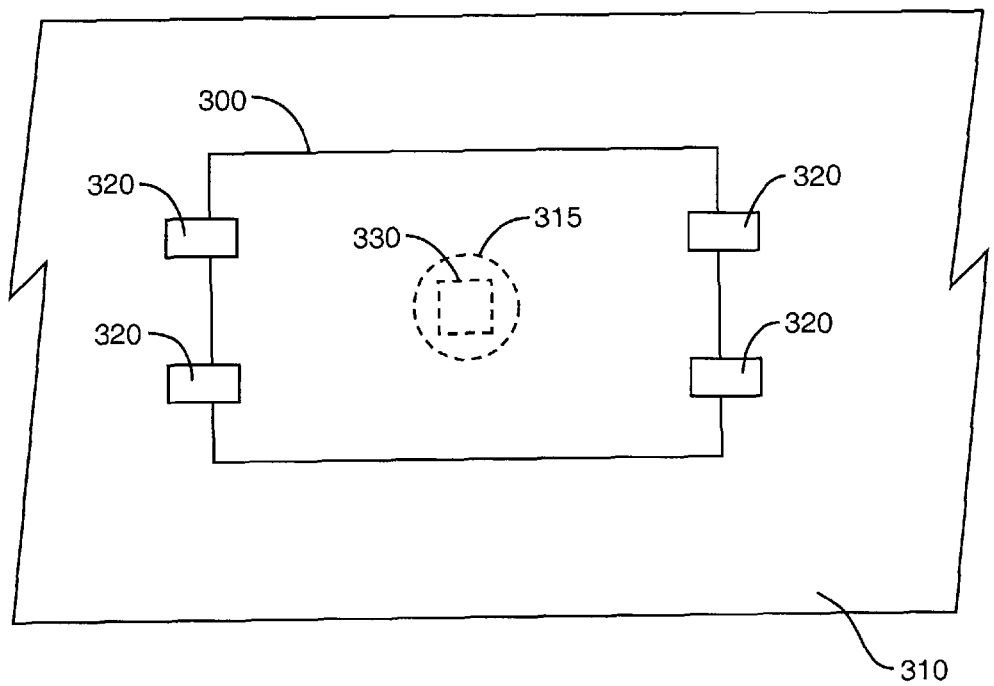
FIG. 3 illustrates an exemplary speaker assembly according to one or more embodiments of the present invention.

FIG. 3A thus illustrates a cross-sectional view of an exemplary speaker assembly according to one or more embodiments of the present invention. A planar piezoelectric element 300 is mounted to a printed circuit board 310 along at least two edges by means of attachment elements 320. As shown, the plane of piezoelectric element 300 is substantially parallel to the plane of the supporting substrate (here, printed circuit board 310). In this manner, the lowest possible profile may be maintained. Attachment elements 320 may in some embodiments comprise a plastic mounting frame; in others, attachment elements 320 may simply comprise an adhesive material, e.g., a resin adhesive. Those skilled in the art will appreciate that any of a variety of other means may be used for mechanically connecting the piezoelectric element 300 to the printed circuit board 310 or, for example, to a housing enclosing the piezoelectric element 300. For instance, the piezoelectric element 300 may be attached to the printed circuit board 310 with adhesive tape (e.g. double-sided tape) around the perimeter of the piezoelectric element 300.

A tuning mass 330 is attached to one face of piezoelectric element 300. In the pictured embodiment, tuning mass 330 is attached to the surface of piezoelectric element 300 that faces the printed circuit board 310. Tuning mass 330 may comprise any suitable material or materials—in some embodiments, tuning mass 330 may simply comprise a dab of resinous material. In others, tuning mass 330 may comprise a plastic or metallic slug attached to the face of piezoelectric element 300 with an adhesive. In some embodiments, tuning mass 330 is placed at or near the center of the surface. However, in other embodiments, the tuning mass 330 may be placed off center. Those skilled in the art will appreciate that the exact effect of the tuning mass 330 will depend on its mass, as well as on the various resonant modes characteristic of the piezoelectric element 300. Locating the mass mid-span has the effect of keeping the resonance frequency as low as possible.

Figure 3B:
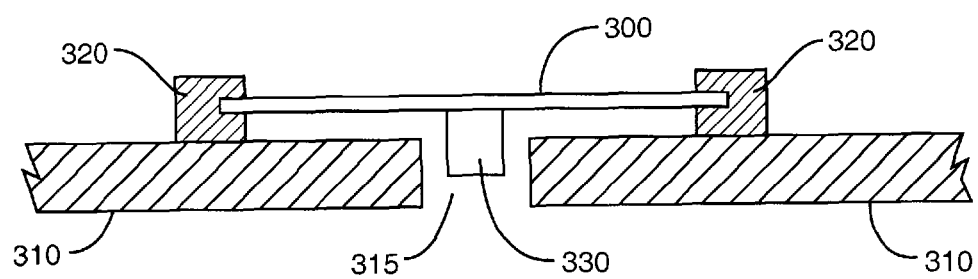

To minimize the height of the overall structure, a cut-out region 315 is provided in printed circuit board 310; the cut-out region 315 is arranged to allow free movement of the tuning mass 330 within the cut-out region 315. Accordingly, the cut-out region 315 is located and sized to allow tuning mass 330 to move up and down as the piezoelectric element 300 vibrates. The cut-out region 315 may, of course, be formed in the printed circuit board 310 by any of several well known manufacturing techniques, some of which may not include any actual "cutting" of the board. Thus, "cut-out region" is intended here to refer to a void in a substrate, which void may be formed by cutting, drilling, punching, forming, or other process in manufacturing or processing a printed circuit board or other substrate. Furthermore, the cut-out region may comprise a hole through the printed circuit board or other substrate, or it may comprise a notch along an edge of the substrate. The former is shown in FIG. 3B, which illustrates a view from above printed circuit board 300. Finally, although the cut-out region of FIG. 3 is illustrated as extending through the printed circuit board 300, those skilled in the art will appreciate that a cut-out region in some embodiments may not extend entirely through the supporting substrate.

Figure 4:
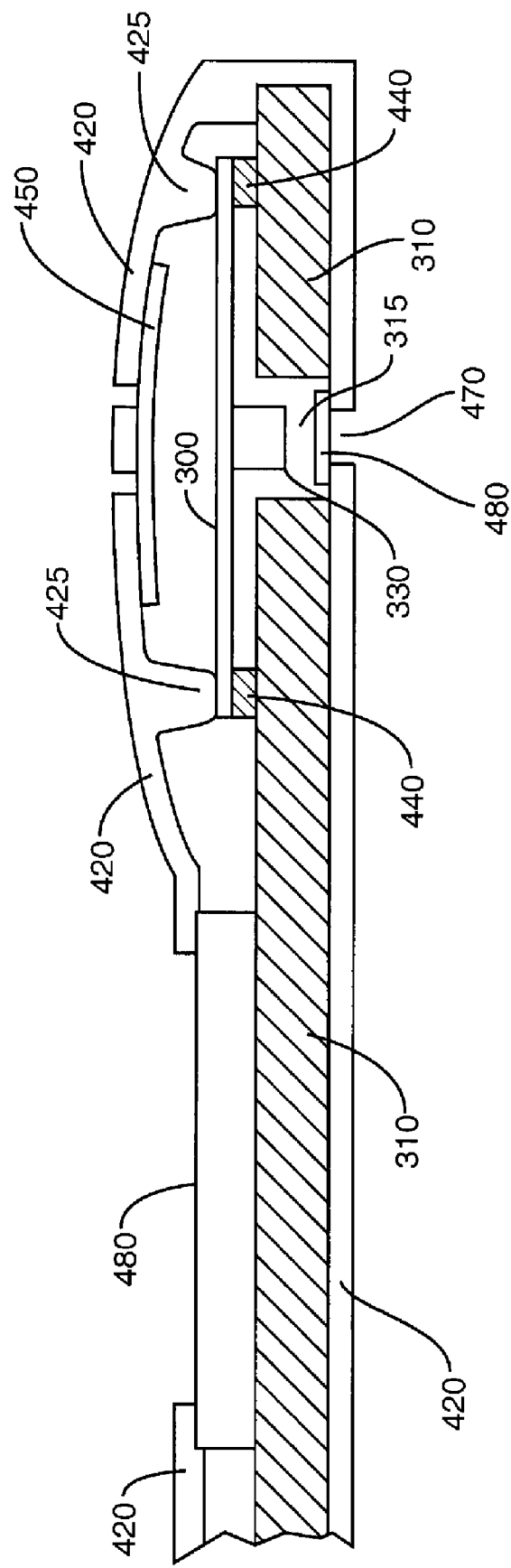
FIG. 4 illustrates another exemplary speaker assembly.

FIG. 4 illustrates an alternative embodiment of a speaker assembly. In this embodiment, planar piezoelectric element 300 is again disposed above and parallel to a printed circuit board 310. As in FIG. 3, a tuning mass 330 is attached to a surface of the piezoelectric element 300, and is free to move within a cut-out region 315 of the printed circuit board 310. In contrast to the assembly of FIG. 3, however, piezoelectric element 300 is mechanically connected to the supporting printed circuit board 310 by means of compression. Housing 420, which may comprise a plastic mobile phone housing, includes fingers 425, which pinch piezoelectric 300 against shims 440 disposed on the printed circuit board 310. Thus, piezoelectric element 300 in this embodiment is held in place at least partly by compression between the housing 420 and the printed circuit board 310.

Also shown in FIG. 4 are several acoustic openings in housing 420; a mesh covering 450 is applied to the inside of housing 420 under these acoustic openings. A tuning port 470, covered by a second mesh covering 480, is provided in housing 220 under the cut-out region 315. Those skilled in the art will recognize that an acoustic cavity may thus be formed by the combination of the housing 420 and the printed circuit board 310. This acoustic cavity may be accounted for using conventional acoustic modeling techniques. However, those skilled in the art will further appreciate that the speaker assemblies disclosed herein are less sensitive to acoustic cavity details because of the inherent stiffness of the piezoelectric element 300.

Electrical connection between the piezoelectric element 300 and other circuitry may be accomplished by various conventional means, including wire attachment, elastomeric connectors, or the like, and is not shown in FIG. 3 or 4. Those skilled in the art will appreciate that the printed circuit board may also be configured to support and to provide electrical interconnections for other components of a portable communication device, such as the LCD display device 480 illustrated in FIG. 4.

As noted above, a piezoelectric speaker element may exhibit several resonant frequencies, the lowest of which dominates the low-frequency response of the speaker element. The resonant frequencies are determined by the physical dimensions of the speaker element, as well as the composition of the element. In general, piezoelectric elements are quite stiff, making them very susceptible to high-frequency vibration.

This stiffness may be reduced by perforating a planar piezoelectric element, for example, by incorporating one or more small holes or slots into the piezoelectric element structure. These perforations, in addition to reducing the mass of the piezoelectric element slightly, serve to reduce the stiffness of the element, thus reducing the frequency of one or more of the characteristic resonances of the device, and improving the low-frequency response of the device. As with the addition of a tuning mass, this perforation of the piezoelectric element may reduce the high-frequency performance of the device. However, high performance at high frequencies may be less important than extending low-frequency performance in many applications.

Figure 5:
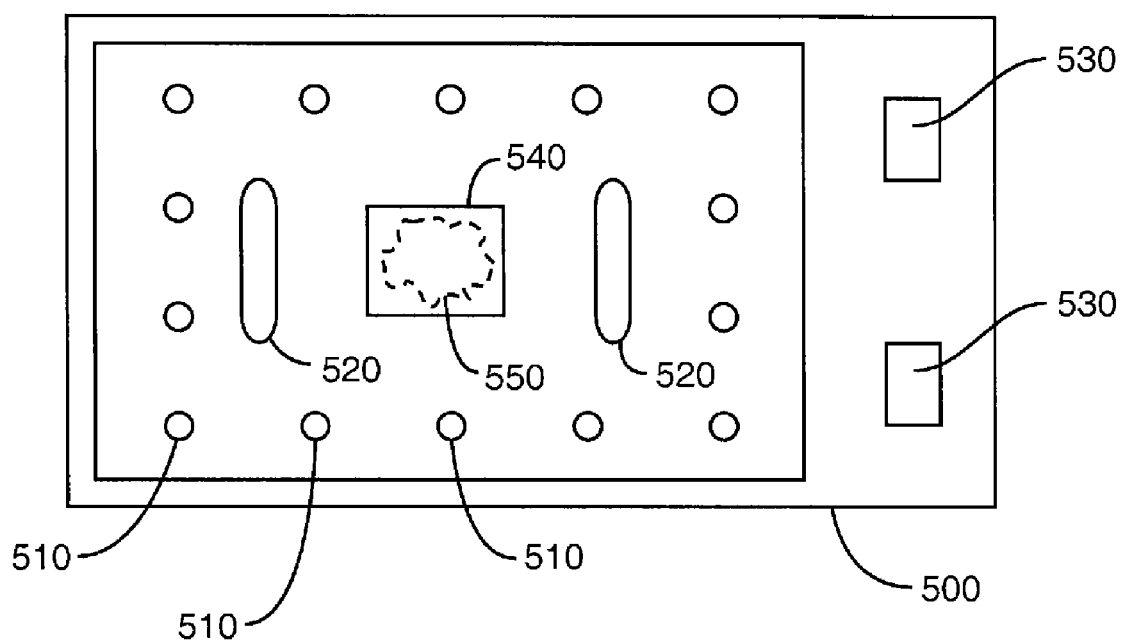
FIG. 5 illustrates a piezoelectric element comprising perforations, according to one or more embodiments of the present invention.

This perforation technique may be combined with the techniques described earlier, to further improve low-frequency performance of a piezoelectric speaker assembly. FIG. 5 thus illustrates an exemplary embodiment of a piezoelectric element 500, characterized by several round perforations 510 as well as two slot-shaped perforations 520. Piezoelectric element 500 further includes two electrical contacts 530, for supplying an amplified audio signal. In addition, a tuning mass 540 is attached to piezoelectric element 500 by means of epoxy adhesive 550.

The speaker assemblies disclosed herein may be used in cellular telephones, personal digital assistants, audio playback devices, and other small electronic devices. The techniques described herein facilitate the assembly of extremely low-profile speaker structures, with improved low-frequency response compared to comparably-sized speakers using conventional technologies.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A speaker assembly comprising:
   a printed circuit board substrate;
   a substantially planar piezoelectric element disposed in a plane above and substantially parallel to the printed circuit board substrate, with a first face of the piezoelectric element disposed towards the printed circuit board substrate, wherein the piezoelectric element is mechanically connected to the printed circuit board substrate at one or more edges of the piezoelectric element and electrically connected to one or more conductors on the printed circuit board substrate; and
   a tuning mass attached to the first face of the piezoelectric element;
   wherein the printed circuit board substrate comprises a cut-out region arranged to allow movement of the tuning mass within the cut-out region.

2. The speaker assembly of claim 1, wherein the piezoelectric element is mechanically connected to the substrate with an adhesive.

3. The speaker assembly of claim 1, wherein the piezoelectric element is compressed against the substrate at said one or more edges of the piezoelectric element by a housing at least partially enclosing the speaker assembly.

4. The speaker assembly of claim 1, wherein the piezoelectric element comprises a multi-layered ceramic piezoelectric bender.

5. The speaker assembly of claim 4, wherein the piezoelectric element comprises one or more perforations extending through the multi-layered ceramic piezoelectric bender.

6. The speaker assembly of claim 4, wherein the one or more perforations comprise at least one slit.

7. The speaker assembly of claim 1, wherein the tuning mass is attached to the first face of the piezoelectric element at approximately the center of the first face.

8. The speaker assembly of claim 1, wherein the tuning mass comprises a resinous material.

9. The speaker assembly of claim 1, wherein the tuning mass comprises a metallic or plastic slug attached to the first face of the piezoelectric element with an adhesive.

10. A communication device including a housing and an ear speaker assembly disposed within the housing, said speaker assembly comprising:
    a printed circuit board substrate;
    a substantially planar piezoelectric element disposed in a plane above and substantially parallel to the printed circuit board substrate, with a first face of the piezoelectric element disposed towards the printed circuit board substrate, wherein the piezoelectric element is mechanically connected to the printed circuit board substrate at one or more edges of the piezoelectric element and electrically connected to one or more conductors on the printed circuit board substrate; and
    a tuning mass attached to the first face of the piezoelectric element;
    wherein the printed circuit board substrate comprises a cut-out region arranged to allow movement of the tuning mass within the cut-out region.

11. The communication device of claim 10, wherein said housing comprises one or more acoustic openings disposed opposite the second face of the piezoelectric element.

12. The communication device of claim 10, further comprising a display device arranged within the housing and electrically connected to the printed circuit board.

13. The communication device of claim 10, wherein the piezoelectric element is compressed against the printed circuit board at said one or more edges of the piezoelectric element by the housing.

14. The communication device of claim 10, wherein the piezoelectric element comprises a multi-layered ceramic piezoelectric bender.

* * * * *